(12) United States Patent
Reinhard et al.

(10) Patent No.: US 7,147,810 B2
(45) Date of Patent: Dec. 12, 2006

(54) DRAPABLE DIAMOND THIN FILMS AND METHOD FOR THE PREPARATION THEREOF

(75) Inventors: Donnie K. Reinhard, East Lansing, MI (US); Jes Asmussen, Okemos, MI (US); Michael F. Becker, East Lansing, MI (US); Timothy A. Grotjohn, Okemos, MI (US); Thomas Schuelke, Brighton, MI (US); Roger Booth, Twin Lake, MI (US)

(73) Assignees: Fraunhofer USA, Inc., Plymouth, MI (US); Board of Trustees of Michigan State University, East Lansing, MI (US)

( * ) Notice: Subject to any disclaimer, the term of this patent is extended or adjusted under 35 U.S.C. 154(b) by 149 days.

(21) Appl. No.: 10/698,921

(22) Filed: Oct. 31, 2003

(65) Prior Publication Data

US 2005/0095429 A1    May 5, 2005

(51) Int. Cl.
  *C23C 16/01*  (2006.01)
  *C23C 16/27*  (2006.01)
(52) U.S. Cl. .............. 264/81; 427/249.8; 427/336; 156/60
(58) Field of Classification Search ........... 264/81; 427/249.8; 239/10; 156/60, 324
  See application file for complete search history.

(56) References Cited

U.S. PATENT DOCUMENTS

| | | | |
|---|---|---|---|
| 4,585,668 A | | 4/1986 | Asmussen et al. |
| 4,727,293 A | | 2/1988 | Asmussen et al. |
| 4,792,772 A | | 12/1988 | Asmussen et al. |
| 4,925,701 A | * | 5/1990 | Jansen et al. ............ 427/575 |
| 5,216,249 A | * | 6/1993 | Jones et al. ........... 250/370.05 |
| 5,311,103 A | | 5/1994 | Asmussen et al. |
| 5,355,568 A | * | 10/1994 | Imai et al. ............... 29/25.35 |
| 5,366,579 A | * | 11/1994 | Yamazaki et al. .......... 156/247 |
| 5,432,004 A | * | 7/1995 | Tanabe et al. ............ 428/408 |
| 5,490,963 A | * | 2/1996 | Fleischer et al. .......... 264/400 |
| 5,587,013 A | * | 12/1996 | Ikegaya et al. ............. 117/89 |
| 5,594,966 A | * | 1/1997 | Goldman ................... 7/120 |
| 5,622,586 A | * | 4/1997 | Vaitkus et al. ............ 156/247 |
| 5,645,937 A | | 7/1997 | Noda |
| 5,660,936 A | * | 8/1997 | Williams ................. 428/408 |
| 5,821,544 A | * | 10/1998 | Augustus et al. ....... 250/440.11 |
| 6,163,401 A | * | 12/2000 | Igarashi ................. 359/435 |
| 6,335,863 B1 | * | 1/2002 | Yamamoto et al. ......... 361/719 |
| 6,511,700 B1 | * | 1/2003 | Airoldi et al. ............ 427/2.29 |
| 2004/0154526 A1 | * | 8/2004 | Mearini et al. ............ 117/68 |

\* cited by examiner

*Primary Examiner*—Bret Chen
(74) *Attorney, Agent, or Firm*—Ian C. McLeod; Mary M. Moyne; Steven E. Merritt (57) ABSTRACT

Wetted thin diamond films which are drapable are described. The films are mounted on various substrates and used as windows for electromagnetic radiation or form a surface coating on an article of manufacture.

15 Claims, 14 Drawing Sheets

DRAPABLE DIAMOND THIN FILMS AND METHOD FOR THE PREPARATION THEREOF

BACKGROUND OF THE INVENTION (1) Field of the Invention

The present invention relates to drapable diamond thin films 10 micrometers or less in thickness. The films are floated in a solution and then are applied from the solution to a substrate. The films can be secured to the substrate.

(2) Description of Related Art

The formation of diamond films by chemical vapor deposition is well known to those skilled in the art. Generally the films are deposited directly on the substrate of interest. The problem is that the diamond films are generally formed at 400° C. or above and many substrates to which the diamond might be applied will not sustain these temperatures.

U.S. Pat. No. 5,645,937 to Noda describes the lamination of diamond films. The films are about 35 micrometers or more in thickness so that they can be peeled from the substrate. These films are relatively brittle and tend to break or crack. U.S. Pat. No. 6,213,380 to Collins describes brazing of a diamond particle compact so that a particular shape of diamond can be obtained.

There is a need for an improved process for forming diamond films into complex shapes, as well as for creating very thin diamond films which can be applied onto complex shapes.

OBJECTS

It is therefore an object of the present invention to provide novel, drapable wetted diamond thin films, preferably less than 10 microns in thickness, which can be bonded to a substrate as a composite. It is further an object of the present invention to provide a process for forming the films and the composites. These and other objects will become increasingly apparent by reference to the following description and the drawings.

SUMMARY OF THE INVENTION

The present invention relates to a method for forming a composite structure with a diamond thin film which comprises:

(a) vapor depositing a diamond thin film (DTF) on a substrate which is dissolvable by a chemical solution which does not dissolve the DTF;

(b) dissolving the substrate in the chemical solution so that the thin film remains in the chemical solution and is drapable; and (c) removing the drapable DTF from the chemical solution and placing the DTF into a non-etching solution so that the DTF floats on the surface of the aqueous non-etching solution. In addition the DTF can be removed from the non-etching solution and deposited while wet on the support means. The support means can be placed in the non-etching solution and then removed from the non-etching solution with the DTF on the support. The non-etching solution is preferably an aqueous solution. The non-etching solution is most preferably essentially water. The DTF provides a transparent window which is transparent to electromagnetic radiation in a holder as the support. The DTF is preferably secured by bonding to the support means.

In particular the present invention relates to a method for forming a composite structure with a diamond thin film which comprises:

(a) vapor depositing a diamond thin film (DTF) on a substrate which is dissolvable by a chemical solution which does not dissolve the DTF;

(b) dissolving the substrate in the chemical solution so that the thin film remains in the chemical solution and is drapable;

(c) removing the drapable DTF from the chemical solution and placing the DTF into a non-etching solution so that the DTF floats on the surface of the aqueous non-etching solution;

(d) placing the drapable DTF on a support means; and (e) securing the drapable DTF on the support means to form the composite structure. In one embodiment the DTF is removed from the non-etching solution and deposited while wet on the support means.

In another embodiment, the support means is placed in the non-etching solution and then removed from the non-etching solution with the DTF on the support.

The present invention further relates to a composite structure prepared by the method which comprises:

vapor depositing a diamond thin film (DTF) on a substrate which is dissolvable by a chemical solution which does not dissolve the DTF;

dissolving the substrate in the chemical solution so that the thin film remains in the chemical solution and is drapable;

removing the drapable DTF from the chemical solution and placing the DTF into a non-etching solution so that the DTF floats on the surface of the aqueous non-etching solution;

placing the drapable DTF on a permanent support means; and securing the drapable DTF on the support means to form the composite structure, wherein the DTF is transparent to electromagnetic radiation.

Further, the present invention relates to a wetted drapable diamond thin film, preferably having a thickness of 10 microns or less, wherein the film can be wrapped around a round rod having a diameter of 3 mm or more. The film is preferably wetted with water.

IN THE DRAWINGS

FIG. 6 was made several weeks after the films were placed in the water.

FIG. 11) and an ultra-nanocrystalline film (A9; FIG. 12).

DESCRIPTION OF PREFERRED EMBODIMENTS

It has been found that synthetic, CVD, diamond can be fabricated into thin, drapable and flexible, large area, free standing diamond sheets. The term "drapable" means to hang limply. The term "thin" means preferably thicknesses of about a micron, or in some cases even less than a micron, and can also mean thicknesses of up to about ten (10) microns. "Area" means here a minimum of several square mm, to a maximum of many square cm, to films with continuous areas of 100's of square cm. An important property of these films is that they can be fabricated into thin sheets. This diamond film then can be separately stored as sheets, or rolled up onto a spool, and then at the appropriate time can be re-wetted and applied to numerous applications such as foils, coatings, multilayered films, etc. and even can be cut up, into various shapes and forms having feature sizes of 100's of cm$^2$ down to microns and less.

For specific applications the wet or dry diamond film can be cut and sized and then attached to other objects. The attachment process includes such techniques as gluing, brazing, etc. as surface forces to adhere the film to the object. In other applications, the dried diamond film can be free standing and can be mounted in a frame. Again an attachment means can be used such as a glue, adhesive or other bonding agent. In some applications, the surface to be covered may be curved, i.e. have a rounded shape such as a sphere, or have corners. In these cases the wetted diamond thin film must be able to be applied (bent, wrapped, etc.) to cover these complex shapes. Thus the diamond thin film must be synthesized with the appropriate mechanical properties to cover and to adhere to complex surfaces, while still retaining the properties of diamond required by the application. Applications of the diamond thin film are numerous and include applying the diamond paper to wear surfaces, cutting tools, inserts, coatings for optical applications such as lenses and free standing optical films. Applications related to the coating of plastic materials/films with diamond thin film are numerous.

The ability to produce and manipulate wetted diamond thin film opens up new and numerous applications of diamond, since the synthesis process is separated from the process of attachment to the application substrate's surface. Thus the numerous new applications of CVD diamond are provided by the present invention.

The separation of the synthesis process from the attachment process is an important advantage of the present invention, since many application materials cannot withstand the high deposition temperatures, typically 400–1000° C., that are required for CVD diamond synthesis. Additionally, even when deposition is possible directly on the desired substrate surface the required high deposition temperatures induce forces/stresses at the diamond-substrate interface as the coated substrate is cooled. These stresses are caused by the mismatch between the thermal expansion coefficients of diamond thin film and the substrate. In the present invention, the wetted diamond thin films are formed and then attached separately to the substrate. The attachment process can then be optimized for the given substrate. The diamond foil application for accelerators described in the Examples is just one example of the many new applications of the wetted diamond thin films.

The third unique feature of this invention is the ability to make the diamond thin films. This requires new manufacturing/fabrication processes that enable the making of both the free standing wetted diamond films themselves and the associated diamond composites. The diamond thin film is very thin and difficult to handle and the present invention provides a number of unique fabrication steps. Additional handling/processing steps included micromanipulation and state-of-the-art micro-assembly at the micron and submicron level.

Important steps which enable the production and application of the flexible and drapable diamond thin films are: (1) the synthesis of large area diamond films on a dummy substrate, (2) a process(es) to separate the film from the dummy substrate and thereby forming a free standing wetted diamond thin films, (3) a method(s) of handling, storing, cutting, wrapping, and manipulating the free standing wetted diamond thin film, and (4) methods of attaching/placing the wetted diamond thin film into/onto the desired application structure.

A fourth unique feature of this invention is the ability to tailor the properties, especially the mechanical or electrical properties, of the diamond thin film. Thus one can engineer the diamond thin film properties to the specific application. The diamond paper is not thin, single crystal diamond but consists of ultranano-, nano- and polycrystalline diamond. The flexibility arises in large part because of the thinness of the material. However, the existence of grain boundaries is also a factor as is the fact that the film is wetted. Thus the deposition process can be altered to achieve the desired film properties.

Properties of the dried diamond thin film can be varied by changing the initial film nucleation process, the film thickness, the crystal size (i.e. polycrystalline, versus nanocrystalline, versus ultra-nanocrystalline), the number and the material content of the grain boundaries (i.e. adding more carbon containing gases or impurity gases) to the deposition process, etc. By altering the synthesis process, the film stiffness, the optical properties, and the mechanical properties and even the sp$^3$ versus sp$^2$ carbon concentrations can be controlled. The diamond thin film can also be post processed such as ion beam treated, or other films can be attached. Diamond thin films with unique properties can be produced. It also can be combined with other thin film materials to form multilayered thin film materials (laminates).

The initial step is to deposit diamond on an etchable substrate. This is done by microwave chemical vapor deposition preferably using processes previously patented by Asmussen et al (U.S. Pat. Nos. 4,585,668; 4,792,772; 4,727,293 and 5,311,103, which are incorporated herein by reference). The films can be polycrystalline or nanocrystalline. Secondly, the film and substrate are separated by dissolving the substrate. One specific method is to use a silicon substrate which is removed by etching, using standard etch recipes from the literature. Thirdly, the diamond thin films are handled in such a way as to avoid breakage. Two methods have been developed to move and transport free-standing films: electrostatic manipulation and liquid transport methods. A third method is where nanorobotics are used. Fourthly, the diamond thin film is cut, for example by lasers, or shaped by other means. Also, storage means for the diamond thin film includes flexible holders such as Mylar. In another example, the diamond thin films can be stored in rolled form. Finally, the films are transferred to their final position, depending on the application, and attached. Applications include the following general categories.

Frame mounts in which the diamond thin film is attached to a frame.

Surface appliques in which the diamond thin film is attached to a surface.

Surface wraps in which the diamond thin film is wrapped around an object.

Transducers in which the diamond thin film is used as an element movable by a force to produce a varying electrical or optical signal.

In the Examples, thickness of the diamond has been in the range of 0.5 micrometers to 2 micrometers. The areas have been up to several $cm^2$. However, in other applications, very small areas, such as on the order of $\mu m^2$, can be used.

Free-standing wetted diamond thin films have been made from CVD diamond deposited in a variety of methods. Three examples are described here.

EXAMPLE 1

A 3-inch diameter silicon wafer was polished with fine diamond powder and placed in a microwave resonant cavity reactor. Input gas flows were 100 sccm argon, 1 sccm methane and 1 sccm hydrogen. The input power was 2 kW, the pressure was 120 torr, and the deposition time was 8 hours. The resulting film was 0.95 micrometers thick and the grain diameters were less than 100 nm. The silicon wafer was then removed.

The wafers of Examples 1, 2 and 3 were cut (or scribed and broken) into the dimension desired for the diamond sheet. The silicon was then removed by etching.

Specifically, the silicon was removed by chemical etching, using etchants that attack silicon but not diamond. Examples are KOH solutions and nitric acid/hydrofluoric acid combinations such as are reported in the literature. Typically used in the Examples has been the volumetric ratio 50 parts $H_2O$:40 parts $HNO_3$:20 parts HF at a bath temperature of approximately 40 degrees C.

The silicon/diamond piece was placed in the etching solution. It was placed on a TEFLON plate with the diamond side down. The silicon/diamond piece was loosely held in place on the plate by a top Teflon piece. The acid etched the silicon until only the diamond was left, still held in place and submerged in the etching solution by the second Teflon piece that acted as a clamp. The TEFLON assembly extended above the surface of the etch solution.

The TEFLON plate, diamond, and clamping Teflon piece were removed from the solution and immersed in a water bath. This step removed remaining etchant. The Teflon plate and clamping piece were raised until the diamond membrane was out of the water and the clamping Teflon piece was removed. The Teflon plate was again lowered in the water bath at a slight angle such that the membrane is lifted off the plate and floated on the surface of the water and was drapable.

The frame or substrate onto which the membrane was to be attached was immersed in the water bath under the film and raised such that the diamond was positioned on the frame or substrate. Then the frame and diamond thin film were removed from the water bath. While wet, the diamond was very flexible. Also, while wet, it was fine-positioned on the frame or substrate. Drying took place in air. For the cases of the frames used for the electron stripping foils, after approximately 30 minutes a brush was used to apply Aquadag™, a commercial carbon colloidal suspension, around the edges of the diamond thin film to hold it onto the frame.

Alternatively, when the diamond sheet is dry it can be lifted by a charged plastic piece, using electrostatic forces.

EXAMPLE 2

A 3-inch diameter silicon wafer was polished with fine (less than 0.25 µm) diamond powder and placed in a microwave plasma cavity reactor. Input gas flows were 200 sccm hydrogen, 8 sccm carbon dioxide, and 3 sccm methane. The input power was 1 kW, the pressure was 33 torr, and the deposition time was 7 hours. The resulting diamond film was 1.71 µm thick and the grain diameters were approximately 100 nm. The diamond coated silicon wafer was then removed as in Example 1.

EXAMPLE 3

A 2-inch diameter silicon wafer was coated with a photoresist layer in which diamond powder had been mixed. The wafer was placed in a microwave resonant cavity reactor. Input gas flows were 200 sccm hydrogen, 8 sccm carbon dioxide, and 3 sccm methane. The input power was 350 W, the pressure was 7 torr, and the deposition time was 40 hours. The resulting diamond film was 2.5 µm thick and the grain diameters were approximately 1 µm. The silicon wafer was then removed as in Example 1.

EXAMPLE 4

The diamond thin films were mounted on three sided and four-sided copper frames.

Figure 1:
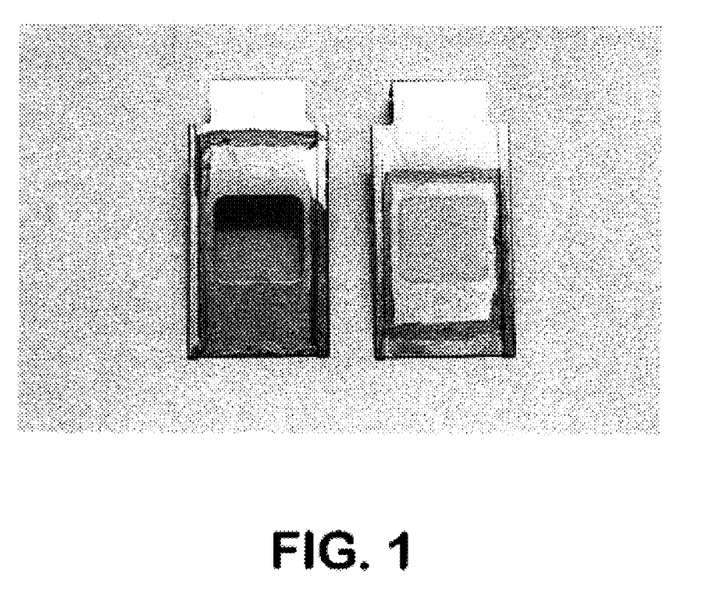
FIG. 1 is a photograph of a dried thin thin film diamond secured to two different four-sided metal supports (holders) which are used as electron stripping foils for a xenon beam. The left side (FB19; 1.25 micrometers) is clear and is nanocrystalline diamond. The right side (S14; 2.0 micrometers) is translucent and is polycrystalline diamond.
Figure 2:
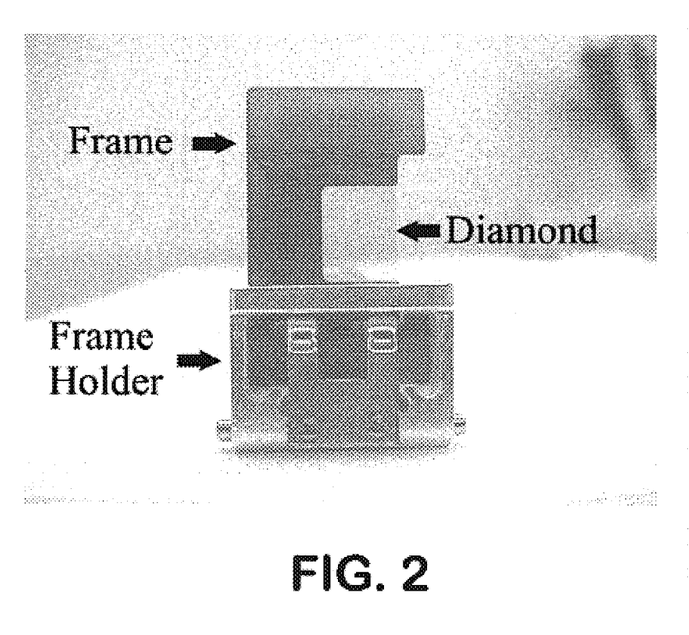
FIG. 2 is a photograph of a dried nanocrystalline diamond film which is attached to a three-sided support (holder; FB24).

Foil size substrate pieces were formed by scribing and breaking and the silicon was removed by wet etching as in the previous Examples. Diamond thin films were attached by AQUADAG M to three-sided and four-sided metal frames. FIGS. 1 and 2 illustrate the four-sided foils and three-sided foils, respectively.

The thickness of the copper frame mounted diamond thin films was not measured. Rough approximations based on weight gain (in the case of S14) and prior experience (in the case of FB19) were 2 and 1.25 micrometers, respectively.

Thickness of the five foils mounted on the three-sided frames were determined optically by observing the separation of spectral transmission peaks according to $$t_{OPT} = \frac{1}{2n\Delta WN}$$

where $t_{OPT}$ is the film thickness, n is the refractive index of diamond, and $\Delta WN$ is the difference in wave numbers of adjacent transmission peaks. The Sellmeir equation was used to calculate the refractive index. From the optically determined thickness, the film density $\rho_F$, in $\mu g/cm^2$, may be calculated from $$\rho_F = 3.515 t_{OPT}$$

where 3.515 g/cm³ is the density of diamond. Results for the films mounted on three-sided foils are in the Table 1.

TABLE 1

Summary of foils mounted on three sided frames

| Sample | type | $t_{OPT}$ (µm) | Density (µg/cm²) |
|---|---|---|---|
| FB24 | nano | 1.71 | 597 |
| FB16 | nano | 1.14 | 400 |
| FB26 | nano | 1.43 | 502 |
| A9 | ultra | 0.95 | 333 |
| S50 | poly | 2.5 | 878 |

EXAMPLE 5

Figure 3:
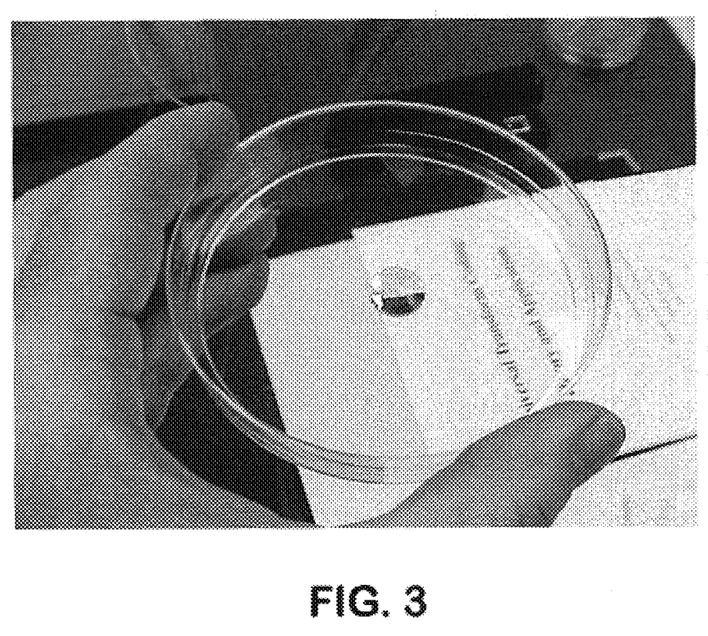
FIG. 3 is a photograph of a convex glass lens with a flexible and drapable film of nanocrystalline diamond on the upper surface. The flexible and drapable diamond film follows the curvature of the convex lens exactly.

In FIG. 3, the diamond thin film from the water as in Example 2 was applied to a convex lens 1 cm in diameter. The film conformed to the lens.

EXAMPLE 6

Figure 4:
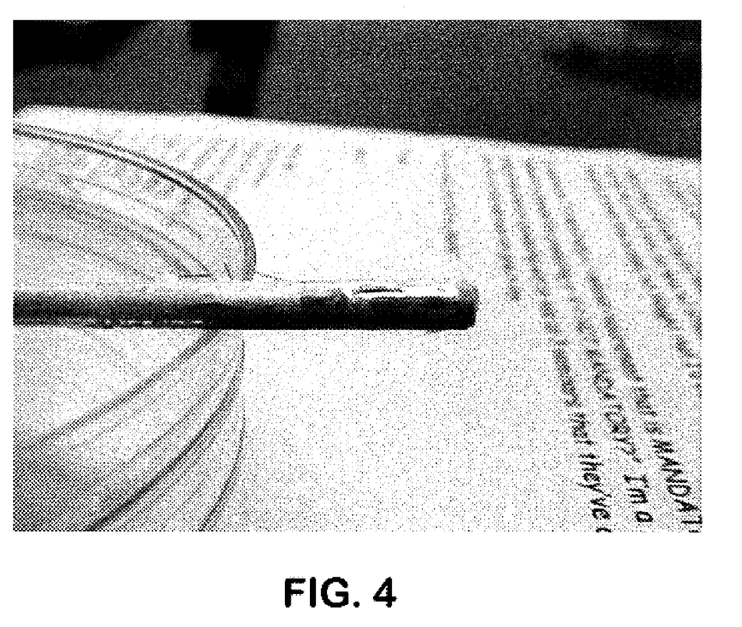
FIG. 4 is a photograph of a wetted (water) flexible nanocrystalline diamond film which is wrapped around an end of a round metal rod (3 mm in diameter).

In FIG. 4 the diamond thin film of Example 2 was wound around a metal rod.

EXAMPLE 7

Figure 5:
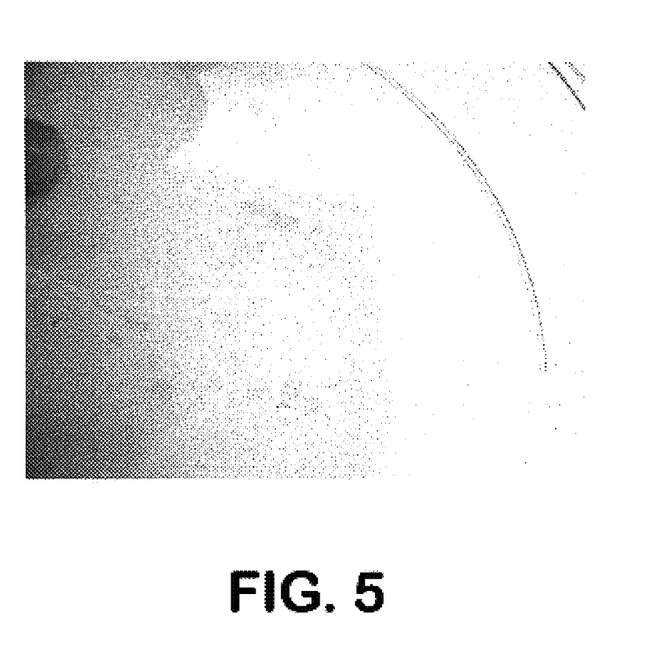
FIG. 5 is a photograph of a dried nanocrystalline diamond thin film applied to a plastic tray. The diamond unexpectedly bonds to the surface of the plastic possibly by an electrostatic attraction.

In FIG. 5 the diamond thin film was applied to a plastic tray. These Examples show the drapability of the film.

EXAMPLE 8

Figure 6:
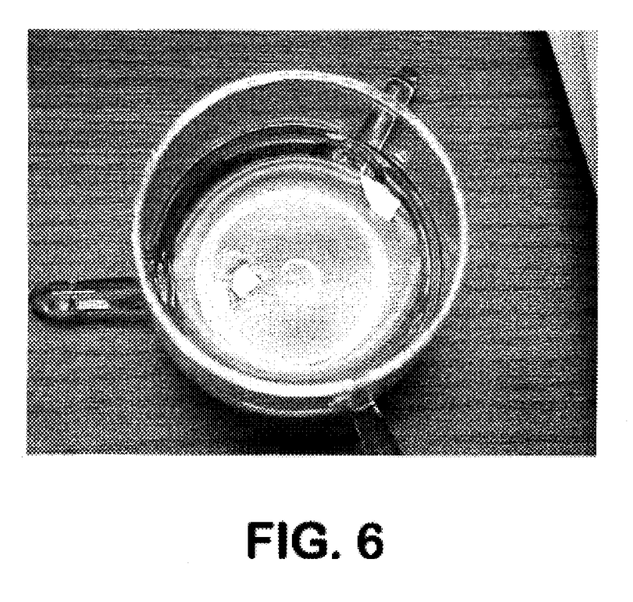
FIG. 6 is a photograph showing two wetted, drapable diamond films floating by surface tension on the surface of a water bath.
Figure 7:
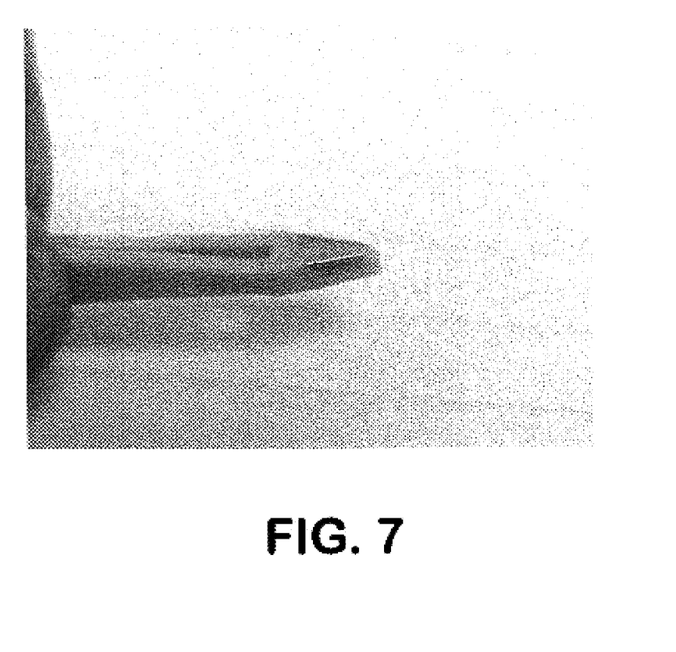
FIG. 7 is a photograph showing one of the wetted, flexible and drapable diamond films of FIG. 6 draped over the end of plastic tweezers.
Figure 8:
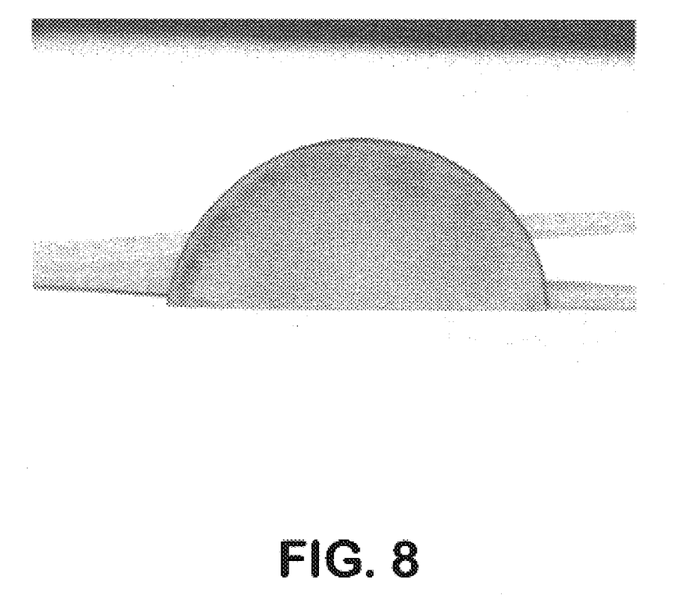
FIG. 8 is a photograph of the wetted diamond film of FIG. 7 which has been applied to a flat surface.
Figure 9:
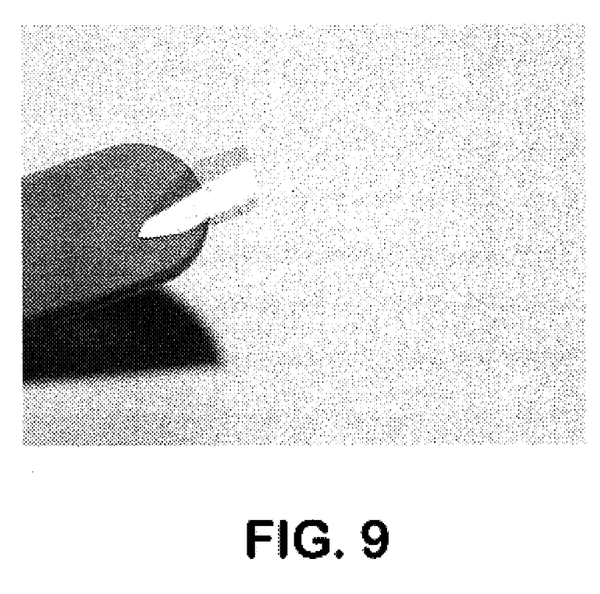
FIG. 9 is a photograph showing that electrostatic forces enabled a plastic wand to pick up the dried film of FIG. 8 from the surface.

FIG. 6 shows the diamond thin film floating in water after removal of the substrate. Plastic tweezers as in FIG. 7 with the wetted diamond thin film draped over the ends were used to transfer the film from the water to a flat surface as in FIG. 8 for drying. The dried film could then be picked up with a plastic wand as shown in FIG. 9 which had been rubbed on cloth by electrostatic attraction.

Figure 10:
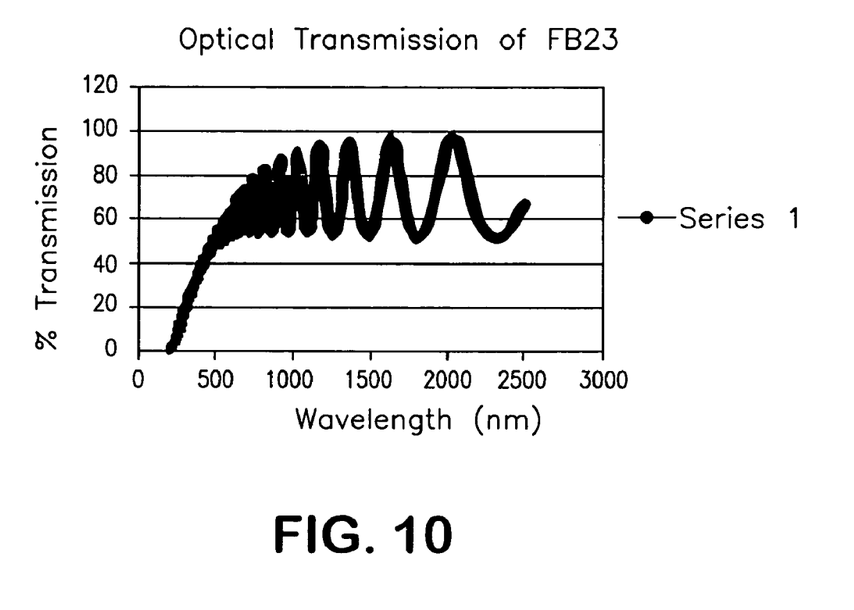
FIG. 10 is a graph showing the sinusoidal optical transmission of dried film FB16 from which the film thickness $t_{opt}$ is determined.

FIG. 10 shows the optical transmission of dried film FB16.

Figure 11:
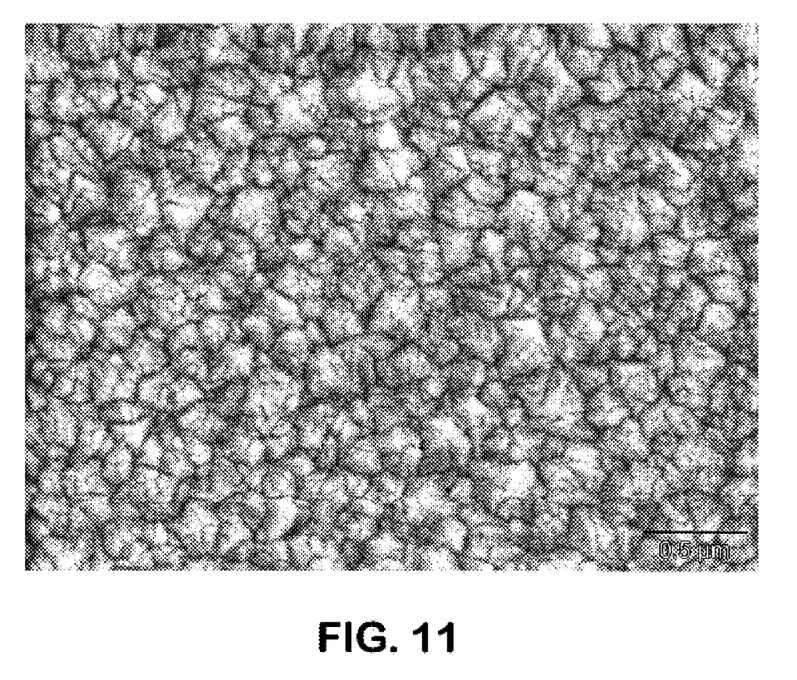
FIGS. 11 and 12 are scanning electron microscope (SEM) views of the dried nanocrystalline film (FB16.
Figure 12:
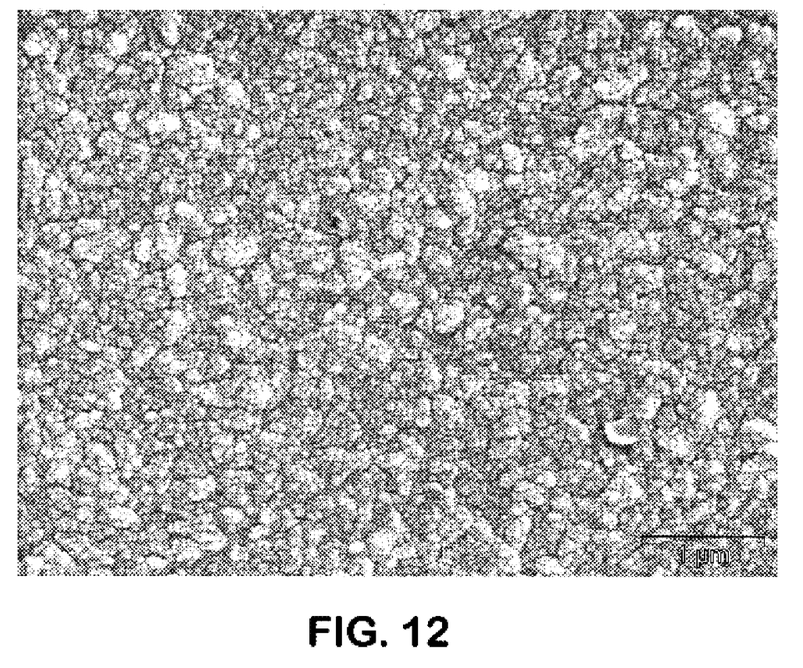
Figure 13:
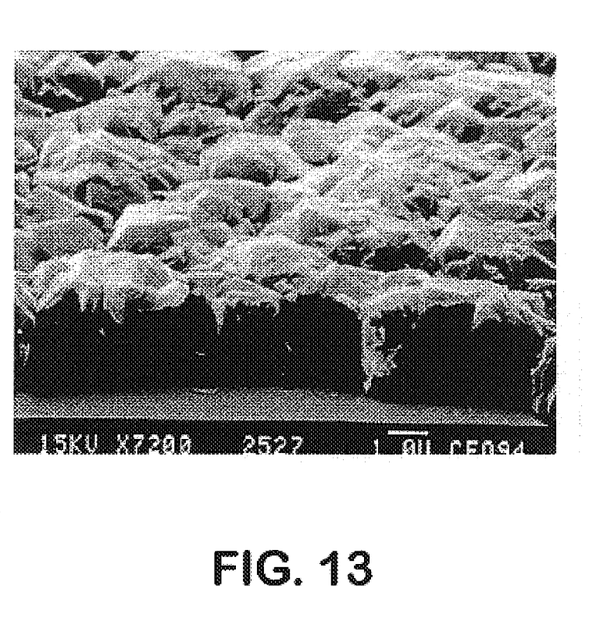
FIG. 13 shows an angled SEM of S52 which was grown under the conditions of Example 9 and which is polycrystalline diamond.
Figure 14:
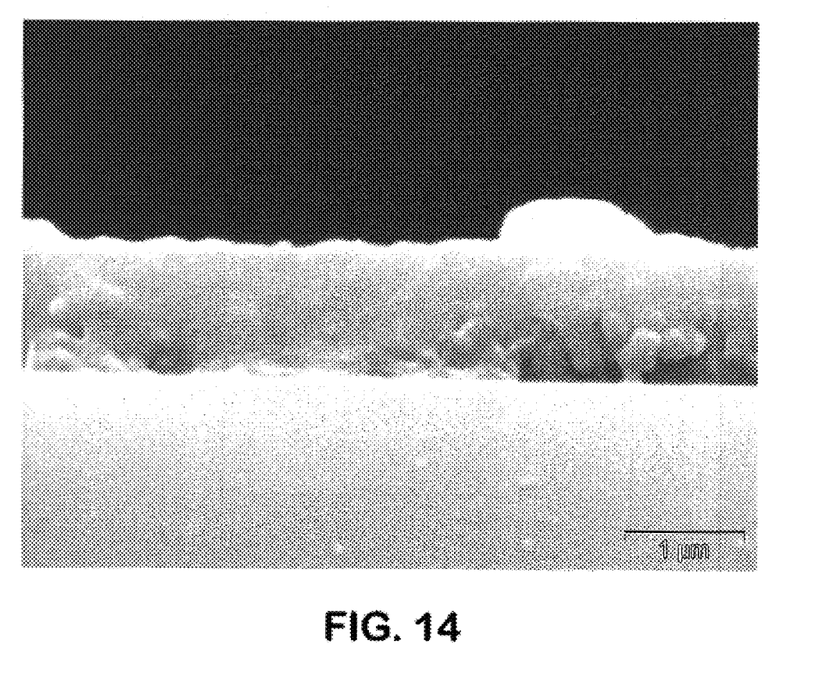
FIG. 14 is an edge view of the dried diamond film of FIG. 11 (FB16).

FIGS. 11 and 14 are SEM's of dried FB16. FIG. 12 is a SEM of A9 and FIG. 13 is an angled view of S52. The SEM's show the crystals of the films.

EXAMPLE 9

The following Example 9 describes the conditions for the growth of S50 and S52. S50 is in Table 1 and S52 is shown in FIG. 13.

A 2-inch diameter silicon wafer was coated with a photoresist layer in which diamond powder had been mixed. The wafer was placed in a microwave resonant cavity reactor. Input gas flows were 200 sccm hydrogen, 8 sccm carbon dioxide, and 3 sccm methane. The input power was 1 kW, the pressure was 15 torr, and the deposition time was 40 hours. The resulting diamond film was 2.3 µm thick and the grain diameters were approximately 2.3 µm. The diamond thin films are used for vacuum ion, electron beam and electromagnetic applications. They are also used as protective coatings.

In this application, the term "polycrystalline" indicates films with grain sizes from several micrometers to less than a micrometer. The term "nanocrystalline" indicates films with sub-micrometer grain size to 100 nanometers or less. The term "ultrananocrystalline" refers to films with grain sizes less than or equal to 100 nanometers to a few nanometers.

It is intended that the foregoing description be only illustrative of the present invention and that the present invention be limited only by the hereinafter appended claims.

We claim:

1. A method for forming a diamond thin film which comprises:
    (a) vapor depositing a diamond thin film (DTF) on a substrate which is dissolvable by a chemical solution which does not dissolve the DTF;
    (b) dissolving the substrate in the chemical solution so that the thin film remains in the chemical solution and is drapable; and
    (c) removing the drapable DTF from the chemical solution and placing the DTF into a non-etching solution so that the DTF floats on the surface of the non-etching solution, wherein the DTF when removed wet from the non-etching solution has the ability to form various shapes as a result of being drapable and to be dried when the non-etching solution is removed from the DTF.

2. The method of claim 1 wherein in addition the DTF is removed from the non-etching solution and deposited while wet on a support means.

3. The method of claim 2 wherein the support means is placed in the non-etching solution and then removed from the non-etching solution with the DTF on the support.

4. The method of claims 1 or 2 wherein the non-etching solution is an aqueous solution.

5. The method of claims 1 or 2 wherein the non-etching solution is essentially water.

6. The method of claims 1 or 2 wherein the DTF provides a window which is transparent to electromagnetic radiation in a holder as a support.

7. The method of claim 2 wherein the DTF is secured by bonding to the support means.

8. The method of claim 1 wherein the film has a thickness of about 10 microns or less.

9. A method for forming a composite structure with a diamond thin film which comprises:
    (a) vapor depositing a diamond thin film (DTF) on a substrate which is dissolvable by a chemical solution which does not dissolve the DTF;

(b) dissolving the substrate in the chemical solution so that the thin film remains in the chemical solution and is drapable;
(c) removing the drapable DTF from the chemical solution and placing the DTF into a non-etching solution so that the DTF floats on the surface of the non-etching solution;
(d) placing the drapable DTF on a support means; and
(e) securing the flexible DTF on the support means and removing the non-etching solution so that the DTF is dry to form the composite structure.

10. The method of claim 9 wherein the DTF is removed from the non-etching solution and deposited while wet on the support means.

11. The method of claim 9 wherein the support means is placed in the non-etching solution and then removed from the non-etching solution with the DTF on the support.

12. The method of any one of claims 9, 10 or 11 wherein the non-etching solution is an aqueous solution.

13. The method of any one of claims 9, 10 or 11 wherein the non-etching solution is essentially water.

14. The method of any one of claims 9, 10 or 11 wherein the DTF provides a window in the holder which is transparent to electromagnetic radiation.

15. The method of claim 9 wherein the DTF is secured by bonding to the support means.

* * * * *